(12) United States Patent
Hara et al.

(10) Patent No.: US 9,865,338 B2
(45) Date of Patent: Jan. 9, 2018

(54) MEMORY SYSTEM AND METHOD OF CONTROLLING NONVOLATILE MEMORY BY CONVERTING WRITE DATA WRITTEN TO A PAGE

(71) Applicant: Toshiba Memory Corporation, Minato-ku (JP)

(72) Inventors: Tokumasa Hara, Kawasaki (JP); Kiichi Tachi, Kamakura (JP); Susumu Tamon, Yokohama (JP); Shigefumi Irieda, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/059,467

(22) Filed: Mar. 3, 2016

(65) Prior Publication Data
US 2017/0060482 A1    Mar. 2, 2017

Related U.S. Application Data

(60) Provisional application No. 62/213,398, filed on Sep. 2, 2015.

(51) Int. Cl.
| | |
|---|---|
| *G11C 11/56* | (2006.01) |
| *G11C 16/10* | (2006.01) |
| *G11C 7/10* | (2006.01) |
| *G11C 16/04* | (2006.01) |
| *G11C 16/26* | (2006.01) |

(52) U.S. Cl.
CPC ........ *G11C 11/5628* (2013.01); *G11C 7/1006* (2013.01); *G11C 16/10* (2013.01); *G11C 11/5642* (2013.01); *G11C 16/0483* (2013.01); *G11C 16/26* (2013.01)

(58) Field of Classification Search
CPC .... G06F 3/0661; G06F 3/0679; G06F 3/0619; G11C 16/10; G11C 16/0483; G11C 11/5628; G11C 11/5642; G11C 16/26
See application file for complete search history.

(56) References Cited

U.S. PATENT DOCUMENTS

| | | | |
|---|---|---|---|
| 7,840,875 B2 | 11/2010 | Conley | |
| 8,341,501 B2 | 12/2012 | Franceschini et al. | |
| 8,756,365 B2 | 6/2014 | Sharon et al. | |
| 8,799,559 B2 | 8/2014 | Sharon et al. | |
| 8,839,073 B2 | 9/2014 | Cohen | |
| 2011/0138104 A1* | 6/2011 | Franceschini ....... | G06F 12/0246 711/103 |
| 2011/0276857 A1* | 11/2011 | Kim ................... | G06F 11/1048 714/763 |

(Continued)

FOREIGN PATENT DOCUMENTS

JP    2010-108029    5/2010

*Primary Examiner* — Richard Elms
*Assistant Examiner* — Jerome Leboeuf
(74) *Attorney, Agent, or Firm* — Oblon, McClelland, Maier & Neustadt, L.L.P.

(57) ABSTRACT

A controller executes a first data conversion for write data to be written into a first page. The first data conversion includes increasing a ratio of a number of a first value to a total number of pieces of data. The controller executes a second data conversion for write data to be written into a second page. The second data conversion includes increasing a ratio of the number of the second value to the total number of pieces of data.

20 Claims, 13 Drawing Sheets

(56) References Cited

U.S. PATENT DOCUMENTS

| 2013/0104002 A1* | 4/2013 | Hara | G06F 11/1072 |
| | | | 714/763 |
| 2014/0032992 A1* | 1/2014 | Hara | G06F 12/0246 |
| | | | 714/773 |
| 2015/0058536 A1* | 2/2015 | Seol | G11C 11/5621 |
| | | | 711/103 |

* cited by examiner

| Page | DATA | | | |
|---|---|---|---|---|
| Upper | 1 → | 0 | 0 ← | 1 |
| Lower | 1 | 1 ← | 0 | 0 |

| Page | DATA | | | | | | | |
|---|---|---|---|---|---|---|---|---|
| Upper | 1 | 1 | 1 → | 0 | 0 | 0 | 0 ← | 1 |
| Middle | 1 | 1 ← | 0 | 0 → | 1 | 1 ← | 0 | 0 |
| Lower | 1 → | 0 | 0 | 0 | 0 ← | 1 | 1 | 1 |

FIG.15

| Page | Top | Higher | Upper | Lower |
|---|---|---|---|---|
| DATA | 0 | 1 | 1 | 1 |
| | 0 | 1 | 0 | 1 |
| | 1 | 1 | 0 | 1 |
| | 1 | 1 | 0 | 0 |
| | 1 | 0 | 0 | 0 |
| | 0 | 0 | 0 | 0 |
| | 0 | 1 | 0 | 0 |
| | 0 | 1 | 1 | 0 |
| | 0 | 0 | 1 | 0 |
| | 0 | 0 | 0 | 1 |
| | 0 | 0 | 0 | 1 |
| | 1 | 0 | 0 | 1 |
| | 1 | 0 | 1 | 1 |
| | 1 | 0 | 1 | 0 |
| | 1 | 1 | 1 | 0 |
| | 1 | 1 | 1 | 1 |

MEMORY SYSTEM AND METHOD OF CONTROLLING NONVOLATILE MEMORY BY CONVERTING WRITE DATA WRITTEN TO A PAGE

CROSS-REFERENCE TO RELATED APPLICATIONS

This application is based upon and claims the benefit of priority from U.S. Provisional Application No. 62/213,398, filed on Sep. 2, 2015; the entire contents of which are incorporated herein by reference.

FIELD

Embodiments described herein relate generally to a memory system including a nonvolatile memory and a method of controlling a nonvolatile memory.

BACKGROUND

In flash memories, in order to raise the frequency of appearance of a memory cell of which a threshold voltage distribution after writing is an erased state, the frequency of appearance of "1" between "1" and "0" included in a write data string is increased.

BRIEF DESCRIPTION OF THE DRAWINGS

FIG. 15 is a diagram that illustrates an example of a data conversion or a lower page, an upper page, a higher page, and a top page;

DETAILED DESCRIPTION

In general, according to this embodiment, memory system includes a nonvolatile memory and a controller. The nonvolatile memory includes a plurality of physical sectors. Each of the physical sectors includes a plurality of memory cells, and each of the memory cells is capable of storing m-bit data using a threshold distribution of m-th power of two. Each of the physical sectors stores data of m pages, m is a natural number of two or more. The controller executes a first data conversion on write data to be written into a first page among the m pages and writes the data converted by the first data conversion into the first page of the nonvolatile memory. The first data conversion includes increasing a ratio of a number of a first value to a total number of pieces of data. The first value is one of the two values, "1" and "0". The total number of pieces of data is a sum of the number of the first value and a number of a second value. The second value is the other one of the two values, "1" and "0". The controller executes a second data conversion on write data to be written into a second pace that is different from the first page among the m pages and writes data converted by the second data conversion into the second page of the nonvolatile memory. The second data conversion includes increasing a ratio of the number of the second value to the total number of pieces of data.

Exemplary embodiments of memory systems and methods of controlling a nonvolatile memory will be explained below in detail with reference to the accompanying drawings. The present invention is not limited to the following embodiments.

(First Embodiment)

Figure 1:
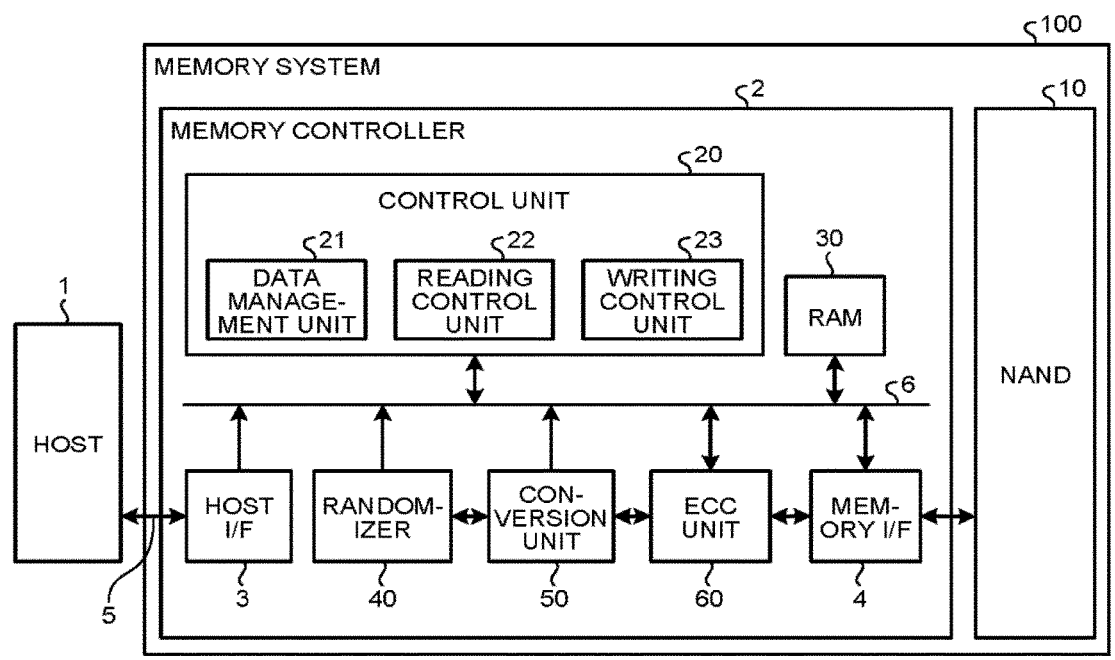
FIG. 1 is a functional block diagram that illustrates the internal configuration of a memory system according to an embodiment.

FIG. 1 is a block diagram that illustrates an example of the configuration of a memory system 100 according to a first embodiment. The memory system 10 connected to a host apparatus (hereinafter, abbreviated as a host) through a communication line 5 and functions as an external storage device of the host 1. TI host 1, for example, may be an information processing apparatus such as a personal computer, a motile phone, or an imaging apparatus, may be a mobile terminal such as a tablet computer or a smart phone, a gaming device, or an in-vehicle terminal such as a car navigation system.

The memory system 100 includes: a NAND flash memory (hereinafter, abbreviated as a NAND) 10 as a nonvolatile memory; and a memory controller 2. The nonvolatile memory is not limited to the NAND flash memory but may be a flash memory having a three-dimensional structure, resistance random access memory (ReRAM), ferroelectric random access memory (FeRAM), or the like.

The NAND 10 includes one or more memory chips each including a memory cell array. The memory cell array includes a plurality of memory cells arranged in a matrix pattern. The memory cell array includes a plurality of blocks that are units for data erasing. Each block is configured by a plurality of physical sectors MS (see FIG. 2). The memory cell array that is a premise of this embodiment is not particularly limited to a specific configuration but may be a memory cell array having a two-dimensional structure as illustrated in FIG. 2, a memory cell array having a three-dimensional structure, or a memory cell array having any other structure.

Figure 2:
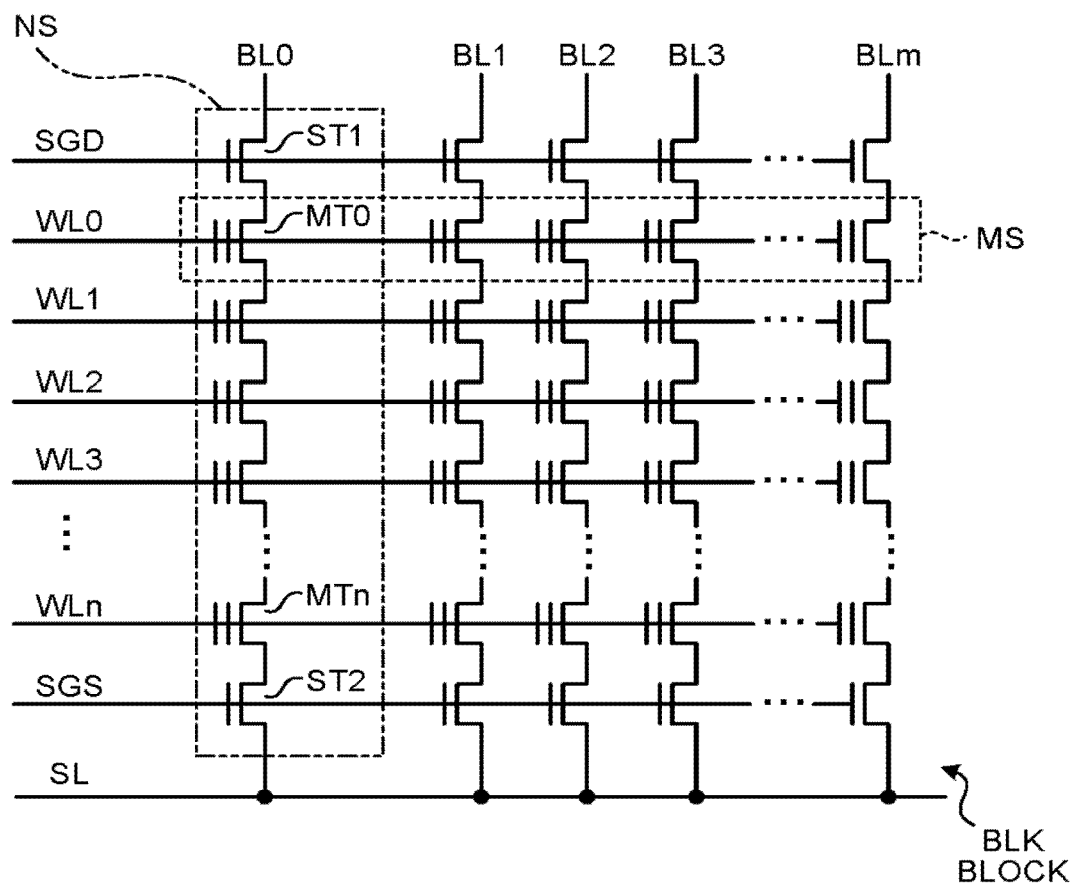
FIG. 2 is a diagram that illustrates an example of the configuration of a block of a memory cell array having a two-dimensional structure.

FIG. 2 is a diagram that illustrates an example of the configuration of a block of the memory cell array having a two-dimensional structure. FIG. 2 illustrates one of a plurality of blocks that configure the memory cell array having the two-dimensional structure. The other blocks of the memory cell array have the same configuration as that illustrated in FIG. 2. As illustrated FIG. 2, the block ELK of the memory cell array includes (m+1) (here, m is an integer of "0" or more) NAND strings NS. Each NAND string NS shares a diffusion region (a source region or a drain region) between memory cell transistors MT adjacent to each other. Each NAND string NS includes: (n+1) (here, n is an integer of zero or more) memory cell transistors MT0 to MTn connected in series; and selection transistors ST1 and ST2 arranged at both ends of the column of the (n+1) memory cell transistors MT0 to MTn.

Word lines WL0 to WLn are respectively connected to control gate electrodes of the memory cell transistors MT0 to MTn that configure the NAND string NS, and, memory cell transistors MTi (here, i=0 to n) included in each NAND string NS are connected to be common using the same word line WLi (here, i=0 to n). In other words, the control gate electrodes of the memory cell transistors MTi disposed in the same row within the block BLK are connected to the same word line WLi.

Each of the memory cell transistors MT0 to MTn is configured by a field effect transistor having a stacked gate structure on a semiconductor substrate. Here, the stacked gate structure includes: a charge storage layer (floating gate electrode) formed on the semiconductor substrate with a gate insulating film being interposed therebetween; and a control gate electrode formed on the charge storage layer with an inter-gate insulating film being interposed therebetween. A threshold voltage of each of the memory cell transistors MT0 to MTn changes according to the number of electrons storable in the floating gate electrode and thus, can store data according to a difference in the threshold voltage.

Bit lines BL0 to BLm are respectively connected to the drains of (m+1) selection transistors ST1 within one block BLK, and a selection gate line SGD is connected to be common to the gates of the selection transistors. In addition, the source of the selection transistor ST1 is connected to the drain of the memory cell transistor MT0. Similarly, a source line SL is connected to be common to the sources of the (m+1) selection transistors ST2 within one block BLK, and a selection gate line SGS is connected to be common to the gates of the selection transistors. In addition, the drain of the selection transistor ST2 is connected to the source of the memory cell transistor MTn.

Each memory cell is connected not only to the word line but also to the bit line. Each memory cell can be identified by using an address used for identifying a word line and an address used for identifying a bit line. As described above, the data of memory cells (the memory cell transistors MT) disposed within the same block BLK is erased altogether. On the other hand, data is written and read in units of physical sectors MS. One physical sector MS includes a plurality of memory cells connected to one word line.

Each memory cell can perform multi-value storage. In a case where the memory cells are operated in a single level cell (SLC) mode, one physical sector MS corresponds to one page. On the other hand, in a case where the memory cells are operated in a multiple level cell (MLC) mode, one physical sector MS corresponds to N pages (here, N is a natural number of two or more). In descriptions presented here, the term MLC mode is assumed to include a triple level cell (TLC) mode of N=3 and a quadruple level cell (QLC) mode of N=4.

In a read operation and a program operation, one word line is selected according to the physical address, and one physical sector MS is selected. A switching of the page within this physical sector MS is performed using the physical address.

In FIG. 1, user data transmitted from the host 1 and management information and firmware (not illustrated in the drawing) of the memory system 100 are stored in the NAND 10. The firmware operates a CPU (not illustrated in the drawing) realizing at least some of the functions of a control unit 20 of the memory controller 2. The firmware described above may be stored in ROM not illustrated in the drawing. The management information described above includes a logical/physical translation table, and the like.

The memory controller 2 includes: a host interface 3; a memory interface 4; a control unit 20; RAM 30; a randomizer 40; a conversion unit 50; and an ECC unit 60. In this embodiment, while the RAM 30 is arranged inside the memory controller 2, the RAM 30 may be disposed outside the memory controller 2. The host I/F 3 executes a process according to the specification of an interface with the host 1 and outputs a command, user data (write data), and the like received from the host 1 to an internal bus 6. In addition, the host I/F 3 transmits user data read from the NAND 10, a response from the control unit 20, and the like to the host 1. The memory I/F 4 directly controls the NAND 10 based on an instruction from the control unit 20.

The RAM 30 is a volatile semiconductor memory that can be accessed at a speed higher than that of the NAND 10. The RAM 30 includes a storage area as a data buffer. Data received from the host 1 is temporarily stored in the RAM 30 before being written into the NAND 10. Data read from the NAND 10 is temporarily stored in the RAM 30 before the transmission thereof to the host 1. The management information stored in the NAND 10 is loaded into the RAM 30. The management information loaded into the RAM 30 is backed up in the NAND 10. The RAM 30 functions also as a buffer in which firmware stored in the NAND 10 is loaded. As the RAM 30, static random access memory (SRAM) or dynamic random access memory (DRAM) is used.

The control unit 20 integrally controls each constituent element of the memory system 100. The control unit 20 includes: a data management unit 21; a reading control unit 22; and a writing control unit 23. The function of the control unit 20 is realized by one or a plurality of CPUs (processors) executing the firmware loaded in the RAM 30 and peripheral circuits thereof. The function of the data management unit 21 is realized by the CPU and/or hardware executing the firmware. The function of the reading control unit 22 is realized by the CPU and/or hardware executing the firmware. The function of the writing control unit 23 is realized by the CPU and/or hardware executing the firmware.

The data management unit 21 manages the user data by using the logical/physical translation table that is one of the above-described management information loaded in the RAM 30. Mapping associating a logical address used by the host 1 and a physical address of the RAM 30 or the NAND 10 with each other is registered in the logical/physical translation table. For the logical address, for example, logical block addressing (LBA) is used. The physical address represents a storage position on the RAM 30 or the NAND 10 in which data is stored.

The writing control unit 23 executes a process for writing data into the NAND 10 in accordance with a write command that is notified from the host 1 through the host I/F 3. For example, in a case where a write request is received from the host 1, the writing control unit 23 acquires a physical position on the NAND 10 that is used for writing data from the data management unit 21 and outputs the physical position and a code word output from the ECC unit 60 to the memory I/F 4.

The reading control unit 22 executes a control process for reading data from the NAND 10 in accordance with a read command notified from the host 1 through the host I/F 3. For example, the reading control unit 22 acquires a physical position on the NAND 10 that corresponds to a logical address of read data from the data management unit 21 and notifies the memory I/F 4 of the physical position.

The randomizer 40 randomizes data written into the NAND 10. In addition, the randomizer 40 de-randomizes data read from the NAND 10. The function of the randomizer 40 is realized by a CPU and/or hardware executing firmware. The randomizer 40 randomizes input data such that the frequency of appearance of "0" and the frequency of appearance of "1" are the same. The randomized data is input to the conversion unit 50.

The conversion unit 50 executes a conversion process for increasing the ratio of appearance of "0" or a conversion process for increasing the ratio of appearance of "1" for data input from the randomizer. That is, the conversion unit 50 increases an appearance ratio of "1" or "0" to a total number of data in comparison with a appearance ratio of "1" or "0" to a total number of data prior to the conversion. The conversion unit 50 executes this conversion process in units of pages. The conversion unit 50 will be described later in detail. The function of the conversion unit 50 is realized by a CPU and/or hardware executing firmware.

The ECC unit 60 executes an error correction coding process for data transmitted from the conversion unit 50, thereby generating parity. The ECC unit 60 outputs a code word including the data and the parity to the memory I/F 4. The memory I/F 4 inputs a code word read from the NAND 10 to the ECC unit 60. The ECC unit 60 executes an error correction decoding process by using the input code word and inputs decoded data to the conversion unit 50. The function of the ECC unit 60 is realized by a CPU and/or hardware executing firmware.

As a coding system used by the ECC unit 60, any system may be used. For example, reed Solomon (RS) coding, Bose Chaudhuri Hocquenghem coding, low density parity check coding, or the like may be used.

In a case where a write request is received from the host 1, the memory system 100 operates as follows. The writing control unit 23 temporarily stores write data into the RAM 30. The writing control unit 23 reads data stored in the RAM 30 and inputs the read data to the randomizer 40. The randomizer 40 randomizes the input data and inputs the randomized data to the conversion unit 50. The conversion unit 50 changes the ratio of appearance of "0" and "1" of the randomized data and inputs resultant data to the ECC unit 60. The ECC unit 60 codes the input data and inputs a code word to the memory I/F 4. The memory I/F 4 writes the input code word into the NAND 10.

In a case where a read request is received from the host 1, the memory system 100 operates as below. The memory I/F 4 inputs the code word read from the NAND 10 to the ECC unit 60. The ECC unit 60 decodes the input code word and inputs decoded data to the conversion unit 50. The conversion unit 50 executes an inverse conversion of the conversion made at the time of writing data and inputs data after the conversion to the randomizer 40. The randomizer 40 de-randomizes the input data and stores de-randomized data into the RAM 30. The reading control unit 22 transmits the data stored in the RAM 30 to the host 1 through the host I/F 3.

In addition, at the time of writing data into the NAND 10, it may be configured such that the code word coded by the ECC unit 60 is randomized by the randomizer 40, the randomized code word is converted by the conversion unit 50, and the code word after the conversion is written into the NAND 10 through the memory I/F 4. In such a case, the code word read from the NAND 10 is inversely converted by the conversion unit 50, is de-randomized by the randomizer 40, is decoded by the ECC unit 60, and then is input to the RAM 30.

Figure 3:
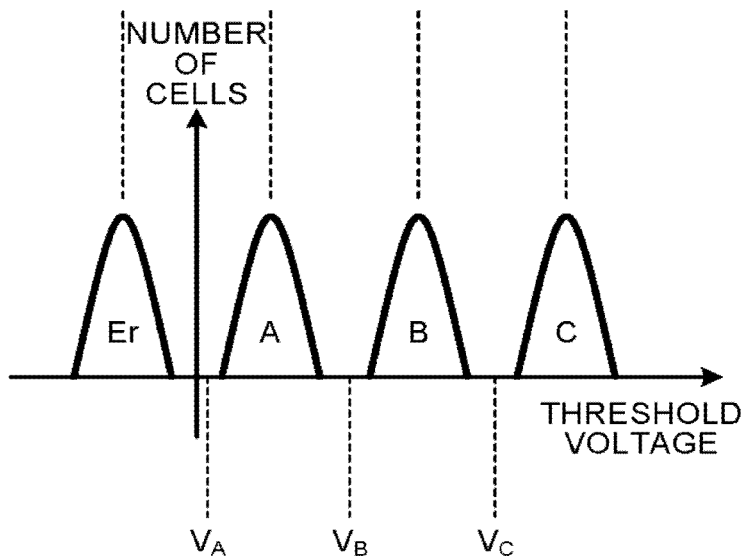
FIG. 3 is a diagram that illustrates an example of a threshold voltage distribution and data coding of memory cells that are 2-bit/cell.

FIG. 3 is a diagram that illustrates an example of a threshold voltage distribution and data coding of memory cells that are 2-bit/cell. In a lower diagram of FIG. 3, the horizontal axis represents a threshold voltage, and the vertical axis represents the number of memory cells. In the case of memory cells that are 2-bit/cell, four distributions formed by a distribution Er, a distribution A, a distribution B, and a distribution C are included. The distribution Er has a lowest threshold voltage and corresponds to a threshold voltage distribution of an erased state. The threshold voltage is higher in order of distributions A, B, and C. Thus, the distribution C has a highest threshold voltage. In a case where memory cells that are 2-bit/cell are used, data values of two bits are associated with the four threshold distributions Er, A, B, and C. Such association is called data coding. The data coding is set in advance, and, at the time of writing (programming) data, electric charge is injected into memory cells such that a threshold voltage distribution corresponding to a data value stored in accordance with data coding is formed. In a case where 2-bit/cell are used, one physical sector corresponds to two pages. Two bits that can be stored in each memory cell correspond to these two pages. In this embodiment, these two pages will be referred to as a lower page and an upper page.

In FIG. 3, an upper diagram is a diagram that illustrates data coding. As illustrated in the upper diagram in FIG. 3, a distribution Er corresponds to a data value of "11", a distribution A corresponds to a data value of "01", a distribution B corresponds to a data value of "00", and a distribution C corresponds to a data value of "10". In this embodiment, when data of the upper page is denoted by Du, and data of the lower page is denoted by Dl, the data value of two bits will be denoted as "DuDl". The data coding illustrated in FIG. 3 is an example, and the data coding is not limited to the example illustrated in FIG. 3. A reading voltage VA is set between the distribution Er and the distribution A, a reading voltage VB is set between the distribution A and the distribution B, and a reading voltage VC is set between the distribution B and the distribution C. Here, VB is a reading voltage used for determining the data value of the lower page, and VA and VC are reading voltages used for determining the data value of the upper page.

In a flash memory, as a transition between a written state (the distributions A, B, and C) and an erased state (the distribution Er) is repeated more, the number of electrons passing through an oxide film of a memory cell increases, whereby the degree of wear becomes higher. In addition, as a writing operation is executed for the distribution C having a higher threshold voltage, interference given to an adjacent memory cell increases, and a probability of causing a read error increases. In order to alleviate such a phenomenon, a process for increasing the frequency of appearance of "1" included in a write data string through a data conversion is executed. In such a technique, "1" in the case of a single level cell (SLC) or "11" in the case of a multi-level cell (MLC) correspond to a threshold voltage distribution of the erased state, and accordingly, by increasing the frequency of appearance of "1", the frequency of appearance of a memory cell of which the threshold voltage distribution after writing is in the erased state (the distribution Er) is increased.

Figure 4:
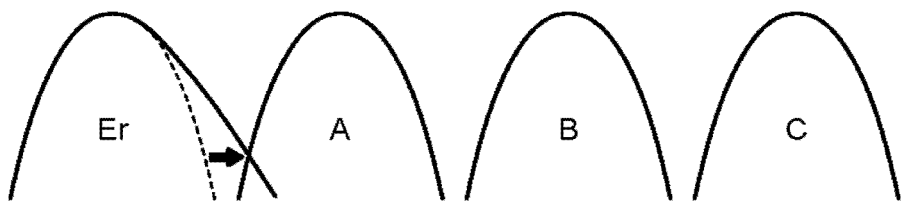
FIG. 4 is a diagram that illustrates an E to A phenomenon.

However, according to a technique for increasing the probability of appearance of the distribution Er to be more than those of the other distributions A, B, and C, in a case where the micronization of a memory further progresses, it is difficult to respond to the following phenomenon. The phenomenon is interference between adjacent cells that occurs due to an increase in a leakage current accompanied with the micronization of cells or a decrease in the increase rate of recording prohibition electric potential in a memory cell channel at the time of writing data. The interference between adjacent cells is a phenomenon in which capacitive coupling occurs between the adjacent cells when there is a large difference between threshold voltages of the adjacent cells, and a threshold voltage of a cell having a lower threshold voltage is increased. According to the interference between the adjacent cells, as illustrated in FIG. 4, the threshold voltage of the memory cell of the distribution Er increases up to the distribution A that is adjacent on the upper side by one unit, and, as a result, there are cases where an erroneous data value is read at the time of reading data. Hereinafter, this phenomenon will be referred to as an E to A phenomenon.

Figures 5, 6:
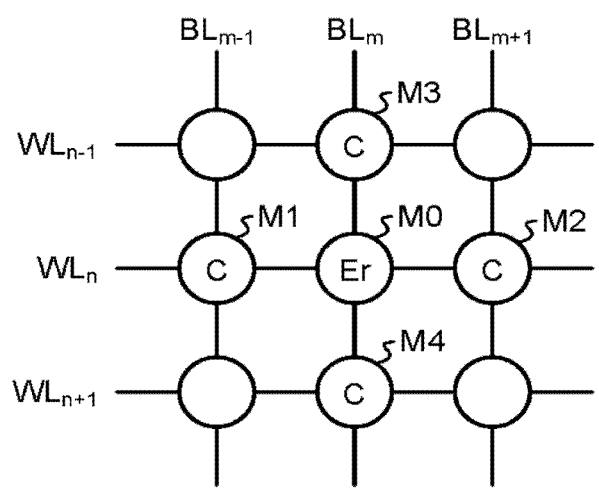
FIG. 5 is a diagram that illustrates an arrangement pattern of a threshold voltage distribution of adjacent cells for which the E to A phenomenon is degraded most.
FIG. 6 is a diagram that illustrates an example of a data conversion on a lower page and an upper page.

FIG. 5 illustrates an arrangement pattern of a threshold voltage distribution of adjacent cells for which the E to A phenomenon is degraded the most. The threshold voltage of the A memory cell MO illustrated in FIG. 5 belongs to the lowest distribution Er. The memory cell MO receives influences from adjacent cells M1 and M2 that are adjacent thereto in the direction of the word line and adjacent cells M3 and M4 that are adjacent thereto in the direction of the bit line. The threshold voltages of all the adjacent cells M1, M2, M3, and M4 belong to the distribution C having a highest threshold voltage, and the memory cell MO is surrounded by the adjacent cells M1, M2, M3, and M4 belonging to the distribution C.

Thus, in this embodiment, by decreasing the frequency of appearance of the arrangement pattern in which the distribution Er is surrounded by the distributions C, as illustrated in FIG. 5, generating the E to A phenomenon described above as possibly as can, the read error is efficiently decreased. In order to decrease the frequency of appearance of the arrangement pattern in which the distribution Er is surrounded by the distributions C, in this embodiment, control is executed such that the frequencies of appearance of the distribution Er that is a distribution of which the threshold voltage is the lowest and the distribution C that is a distribution of which the threshold voltage is the highest are lower than the frequencies of appearance of the distributions A and C that are distributions of which the threshold voltages are intermediate.

Each two-bit data stored in a four-value memory cell is assigned to different pages (the lower page and the upper page). On the other hand, the writing of data into the NAND 10, as described above, is executed in units of pages. In other words, data of two pages (the lower page and the upper page) is written independently for a plurality of memory cells (physical sector) connected to a same word line. For this reason, the threshold distribution of memory cells determined based on data corresponding to two pages cannot be directly controlled as the entirety of the two pages. Thus, in this embodiment, the ratio of appearance of "1" or "0" is changed through a data conversion for each page.

The conversion unit 50 illustrated in FIG. 1 executes a data conversion used for changing the ratio of appearance of "1" or "0". FIG. 6 is a diagram that illustrates a data conversion executed by the conversion unit 50 in a case where the data coding illustrated in FIG. 3 is used. In FIG. 6, each arrow is represented such that the base end side of the arrow corresponds to a data value of which the ratio of appearance decreases, and the tip end side of the arrow corresponds to a data value of which the ratio of appearance increases. In other words, each arrow does not indicate changing "1" to "0" or "0" to "1". FIG. 6 illustrates that a data conversion for increasing a ratio of a number of "1" to a total number of pieces of data of the lower page in comparison with a ratio of a number of "1" to a total number of pieces of data of the lower page prior the conversion is executed for the lower page, and a data conversion for increasing a ratio of a number of "0" to a total number of pieces of data of the lower page in comparison with a ratio of a number of "0" to a total number of pieces of data of the lower page prior the conversion is executed for the upper page. The total number of pieces of data is a number of pieces of data of each page configured of "0" and "1". In other words, for a first page, the ratio of appearance of a first value that is one of the two values, "1" and "0" to the total number of pieces of data is increased in comparison with the ratio of appearance of the first value prior to the conversion, as a result, the ratio of appearance of a second value that is the other one of the two values to the total number of pieces of data is decreased in comparison with the ratio of appearance of the second value prior to the conversion. For a second page, the ratio of appearance of the second value to the total number of pieces of data is increased in comparison with the ratio of appearance of the second value prior to the conversion, as a result, the ratio of appearance of the first value to the total number of pieces of data is decreased in comparison with the ratio of appearance of the first value prior to the conversion.

Figure 7:
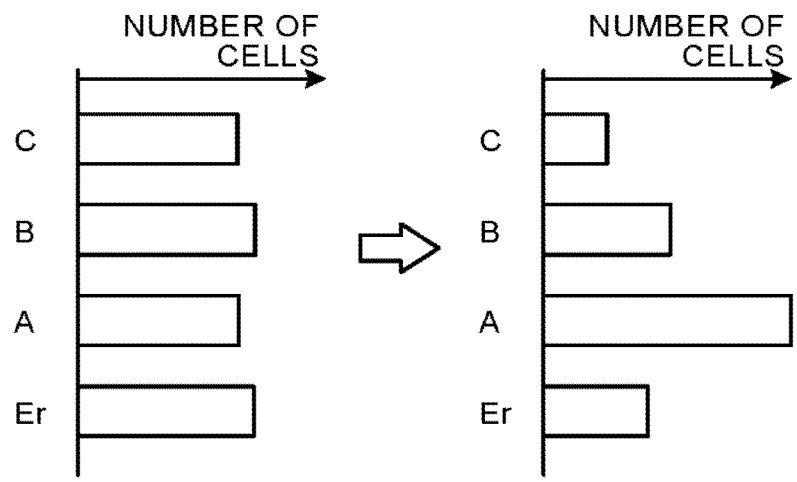
FIG. 7 is a diagram that illustrates a threshold voltage distribution before a data conversion and a threshold voltage distribution after the conversion in case of 2-bit/cell.

FIG. 7 illustrates a threshold voltage distribution. The left side in FIG. 7 illustrates a threshold voltage distribution before the data conversion illustrated in FIG. 6, and the right side in FIG. 7 illustrates a threshold voltage distribution after the data conversion illustrated in FIG. 6. As illustrated on the left side in FIG. 7, before the data conversion, data is randomized by the randomizer 40, and accordingly, the frequencies of appearance of distributions Er, A, B, and C are almost the same. In contrast to this, as illustrated in FIG. 7, after the data conversion, the frequency of appearance of the distribution A increases the most, the frequency of appearance of the distribution C decreases the most, and the frequency of appearance of the distribution Er decreases.

Figure 8:
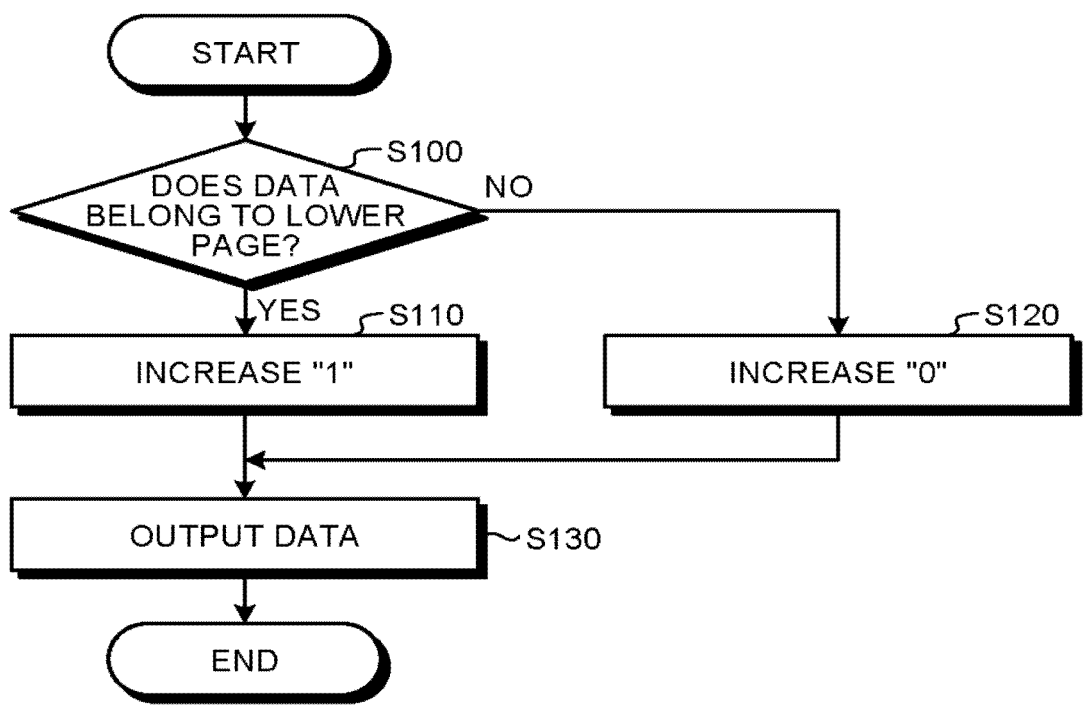
FIG. 8 is a flowchart that illustrates an example of a data conversion process according to a first embodiment.

FIG. 8 is a diagram that illustrates an example of a data conversion process, which is executed by the conversion unit 50, according to the first embodiment. The conversion unit 50 determines whether or not data input from the randomizer 40 belongs to the lower page (Step S100). In a case where the input data is determined to belong to the lower page based on this determination (Step S100, Yes), the conversion unit 50 executes the data conversion increasing the ratio of appearance of "1" of the input data (Step S110). The conversion unit 50 outputs converted data to the ECC unit 60 (Step S130). On the other hand, in a case where the input data is determined to belong to the upper page (Step S100, No), the conversion unit 50 executes the data conversion increasing the ratio of appearance of "0" of the input data (Step S120). The conversion unit 50 outputs converted data to the ECC unit 60 (Step S130).

Next, an example of a technique for the conversion process executed by the conversion unit 50 will be described. According to a first technique, an inverse conversion of Huffman coding is executed, whereby data is expanded to a variable length. According to this first technique, in a case where data is to be expanded, the ratio of appearance of "1" or "0" is changed. For example, by converting "1" into "111", converting "010" into "101", and converting "00000" into "000", the ratio of appearance of "1" is increased, and the ratio of appearance of "0" is decreased.

According to a second technique, data is expanded to a fixed length by using a certain code conversion. For example, in a case where four bits are converted into five bits, "1111" is converted into "11111", "1110" is converted into "11110", "1101" is converted into "11101", "1001" is converted into "11100", . . . , "0001" is converted into "01011", and "0000" is converted into "00111". By using such a code conversion table, the ratio of appearance of "1" is increased, and the ratio of appearance of "0" is decreased. The conversion unit 50 may change the ratio of appearance of "0" and "1" by using an arbitrary technique other than the first and second techniques. For example, run length limited (RLL) coding or enumerative coding may be used, and any other method may be used.

Figure 9:
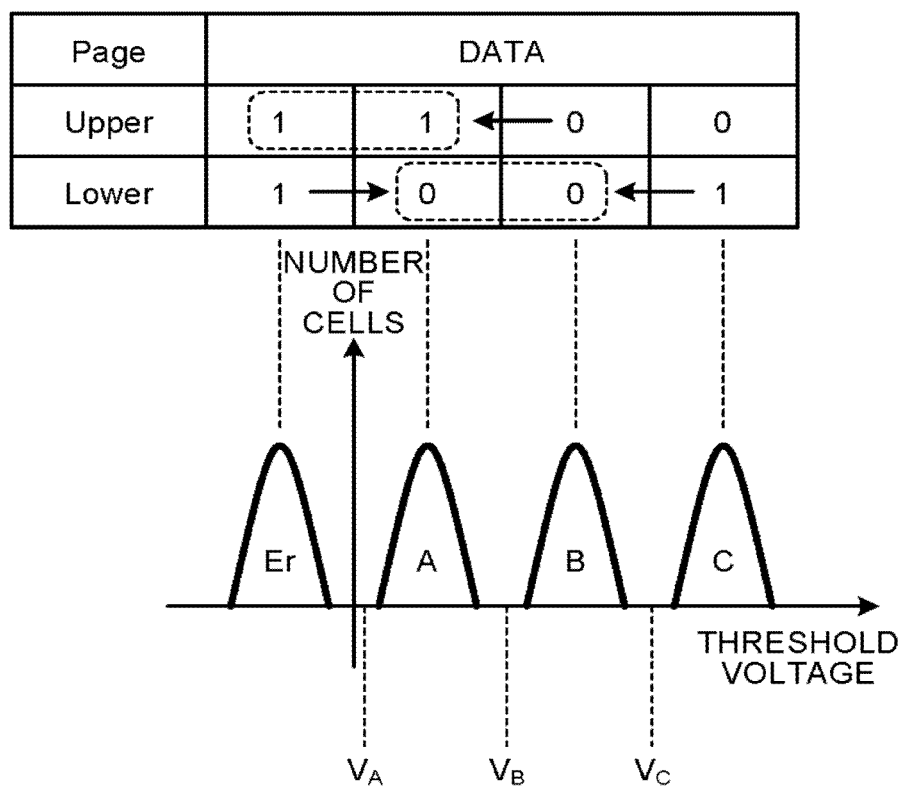
FIG. 9 is a diagram that illustrates another example of data coding of a 2-bit/cell and an example of a data conversion on a lower page and an upper page.

FIG. 9 is a diagram that illustrates an example of another data coding, which is different from that illustrated in FIG. 3, and a data conversion executed by the conversion unit 50 in the case of the data coding. In this example, a distribution Er corresponds to a data value of "11", a distribution A corresponds to a data value of "10", a distribution B corresponds to a data value of "00", and a distribution C corresponds to a data value of "01". In the case of this data coding, as illustrated in an upper diagram of FIG. 9, the conversion unit 50 executes a data conversion increasing the ratio of appearance of "0" to the total number of pieces of data for a lower page and executes a data conversion increasing the ratio of appearance of "1" to the total number of pieces of data for an upper page.

Data coding other than the data coding illustrated in FIGS. 3 and 9 may be used. Also in such a case, the conversion unit 50 changes the ratio of appearance of "0" and "1" to the total number of pieces of data of each page such that the frequencies of appearance of the distribution Er having a lowest threshold voltage and the distribution C having a highest threshold voltage are decreased, and the frequencies of appearance of the distributions A and C each having a threshold voltage of an intermediate level are increased.

In this way, in the first embodiment, the ratio of appearance of "0" and "1" of each page data are changed such that the frequencies of appearance of the distribution Er having a lowest threshold voltage and the distribution C having a highest threshold voltage are decreased, and the frequencies of appearance of the distributions A and C each having a threshold voltage of an intermediate level are increased. For this reason, the frequency of appearance of the arrangement pattern in which the distribution Er is surrounded by the distributions C can be decreased, and the number of error bits at the time of reading data can be efficiently decreased.

(Second Embodiment)

Figure 10:
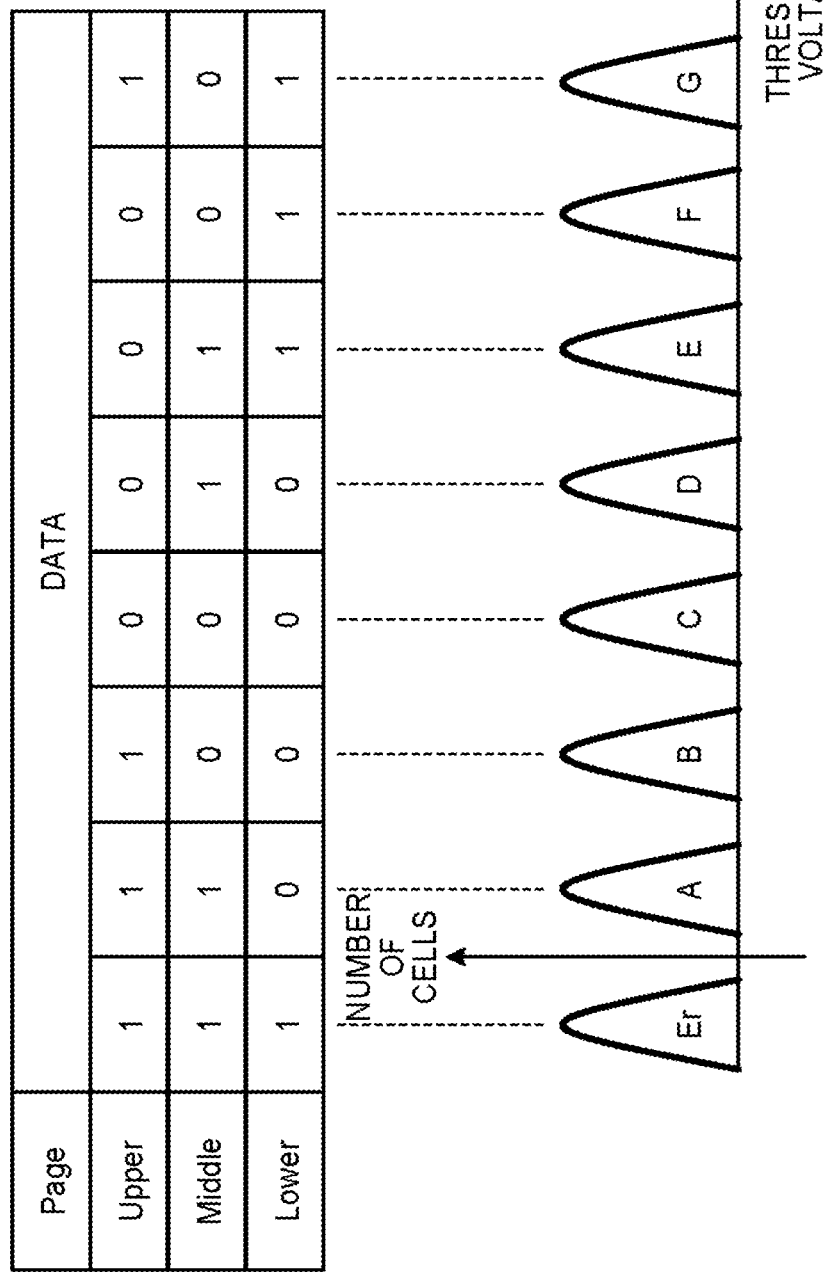
FIG. 10 is a diagram that illustrates an example of a threshold voltage distribution and data coding of memory cells that are 3-bit/cell.

In a second embodiment, a data conversion for memory cells that are 3-bit/cell will be described. FIG. 10 is a diagram that illustrates an example of a threshold voltage distribution and data coding of memory cells that are 3-bit/cell. As illustrated in a lower diagram of FIG. 10, in the case of memory cells that are 3-bit/cell, eight distributions formed by a distribution Er, a distribution A, a distribution B, a distribution C, a distribution D, a distribution E, a distribution F, and a distribution G are included. The distribution Er has a lowest threshold voltage and corresponds to a threshold voltage distribution of the erased state. The threshold voltage is higher in order of the distributions A, B, C, D, E, F, and G. The distribution G has a highest threshold voltage.

Accordingly, in the case of memory cells that are 3-bit/cell, a state in which the memory cell M0 illustrated in FIG. 5 is surrounded by adjacent cells M1, M2, M3, and M4 belonging to the distribution G becomes the arrangement pattern of a threshold voltage distribution for which the E to A phenomenon is degraded the most. In a case where the memory cells that are 3-bit/cell are used, data values of three bits are associated with the eight threshold distributions Er, A, B, C, D, E, F, and G. In the case where 3-bit/cell are used, one physical sector corresponds to three pages. Three bits that can be stored in each memory cell correspond to the three pages. In this embodiment, these three pages will be referred to as a lower page, a middle page, and an upper page.

An upper diagram of FIG. 10 is a diagram that illustrates an example of data coding. As illustrated in the upper diagram of FIG. 10, the distribution Er corresponds to a data value of "111", the distribution A corresponds to a data value of "110", the distribution B corresponds to a data value of "100", the distribution C corresponds to a data value of "000", the distribution D corresponds to a data value of "010", the distribution E corresponds to a data value of "011", the distribution F corresponds to a data value of "001", and the distribution G corresponds to a data value of "101". In this embodiment, when data of an upper page is denoted by Du, data of a middle page is denoted by Dm, and data of a lower page is denoted by Dl, the data value of three bits will be denoted as "DuDmDl". The data coding illustrated in FIG. 10 is an example, and thus, the data coding is not limited to the example illustrated in FIG. 10.

Figures 11, 12:
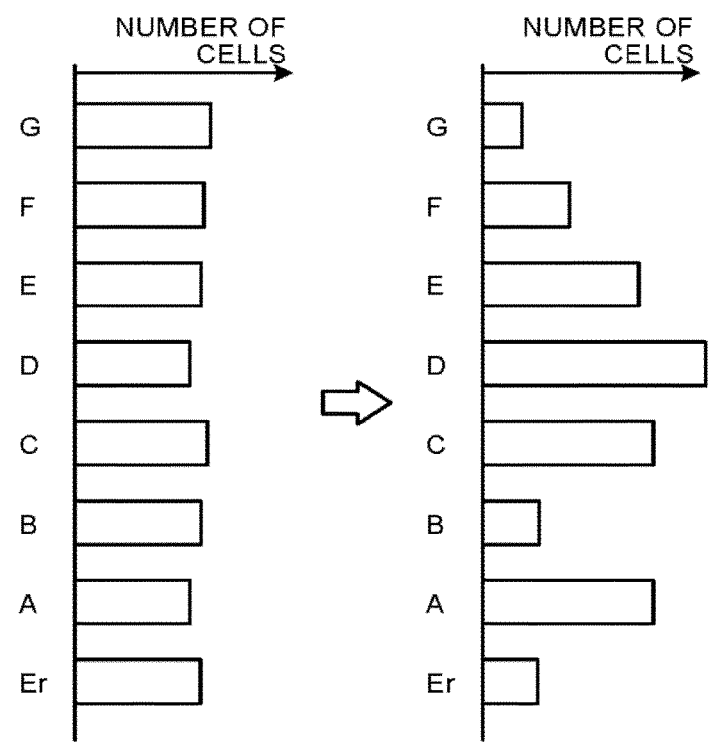
FIG. 11 is a diagram that illustrates an example of a data conversion on a lower page, a middle page, and an upper page.
FIG. 12 is a diagram that illustrates a threshold voltage distribution before a data conversion and a threshold voltage distribution after the conversion in case of 3-bit/cell.

FIG. 11 is a diagram that illustrates a data conversion executed by the conversion unit 50 in a case where the data coding illustrated in FIG. 10 is used. In the case illustrated in FIG. 11, a data conversion increasing the ratio of appearance of "0" to the total number of pieces of data of the lower page is executed for the lower page, a data conversion increasing the ratio of appearance of "1" to the total number of pieces of data of the middle page is executed for the middle page, and a data conversion increasing the ratio of appearance of "0" to the total number of pieces of data of the upper page is executed for the upper page.

FIG. 12 is a diagram that illustrates threshold voltage distributions. The left side in FIG. 12 illustrates a threshold voltage distribution before the data conversion illustrated in FIG. 11, and the right side in FIG. 12 illustrates a threshold voltage distribution after the data conversion illustrated in FIG. 11. As illustrated on the left side in FIG. 12, before the data conversion, data is randomized by the randomizer 40, and accordingly, the frequencies of appearance of the distributions Er, A, B, C, D, E, F, and G are almost the same. In contrast to this, as illustrated on the right side in FIG. 12, after the data conversion, the frequency of appearance of the distribution D is increased the most, the frequency of appearance of the distribution G is decreased the most, and the frequency of appearance of the distribution Er is decreased.

Figure 13:
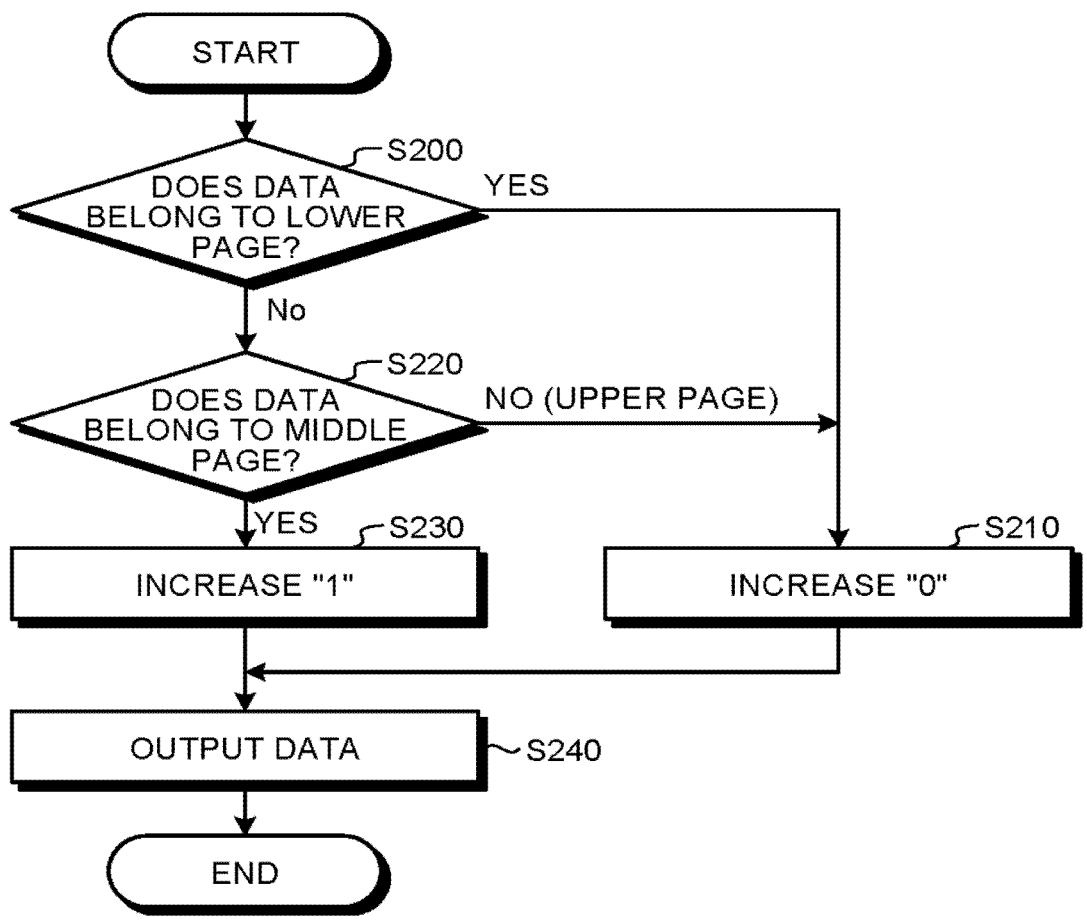
FIG. 13 is a flowchart that illustrates an example of a data conversion process according to a second embodiment.

FIG. 13 is a flowchart that illustrates an example of a data conversion process, which is executed by the conversion unit 50, according to the second embodiment. The conversion unit 50 determines whether or not data input from the randomizer 40 belongs to a lower page (Step S200). In a case where the input data is determined to belong to a lower page based on this determination (Step S200, Yes), the conversion unit 50 executes the data conversion increasing the ratio of appearance of "0" of the input data (Step S210). The conversion unit 50 outputs the converted data to the ECC unit 60 (Step S240). On the other hand, in a case where the input data is determined to belong to a middle page (Step S200, No and Step S220, Yes), the conversion unit 50 executes the data conversion increasing the ratio of appearance of "1" of the input data (Step S230). The conversion unit 50 outputs converted data to the ECC unit 60 (Step S240). In addition, in a case where the input data is determined to belong to an upper page (Step S200, No and Step S220, No), the conversion unit 50 executes the data conversion increasing the ratio of appearance of "0" of the input data (Step S210). The conversion unit 50 outputs converted data to the ECC unit 60 (Step S240).

The data conversion illustrated in FIG. 11 is effective in a case where the data coding illustrated in FIG. 10 is used. In a case where data coding different from that illustrated in FIG. 11 is used, the ratio of appearances of "0" and "1" of the data of each page may be changed such that the frequencies of appearance of the distribution Er having a lowest threshold voltage and the distribution G having a highest threshold voltage are decreased, and the frequencies of appearance of the distributions A to F each having a threshold voltage of an intermediate level are increased. As a technique of such a case, there are a first method that is similar to the data conversion illustrated in FIG. 11 and a second method different from the data conversion illustrated in FIG. 11. According to the first method, the ratio of appearance of "0" is increased for data of two pages among the lower page, the middle page, and the upper page, and the ratio of appearance of "1" is increased for data of the remaining one page. According to the second method, the ratio of appearance of "1" is increased for data of two pages among the lower page, the middle page, and the upper page, and the ratio of appearance of "0" is increased for data of the remaining one page. In the case of memory cells that are 3-bit/cell, any one of the first method and the second method may be used.

In this way, according to the second embodiment, the ratio of appearances of "0" and "1" of the data of each page are changed such that the frequencies of appearances of the distribution Er having the lowest threshold voltage and the distribution G having the highest threshold voltage are decreased, and the frequencies of appearance of the distributions A to F each having a threshold voltage of an intermediate level are increased. For this reason, the frequency of appearance of the arrangement pattern in which the distribution Er is surrounded by the distributions G can be decreased, and the number of error bits at the time of reading data can be efficiently decreased.

(Third Embodiment)

Figure 14:
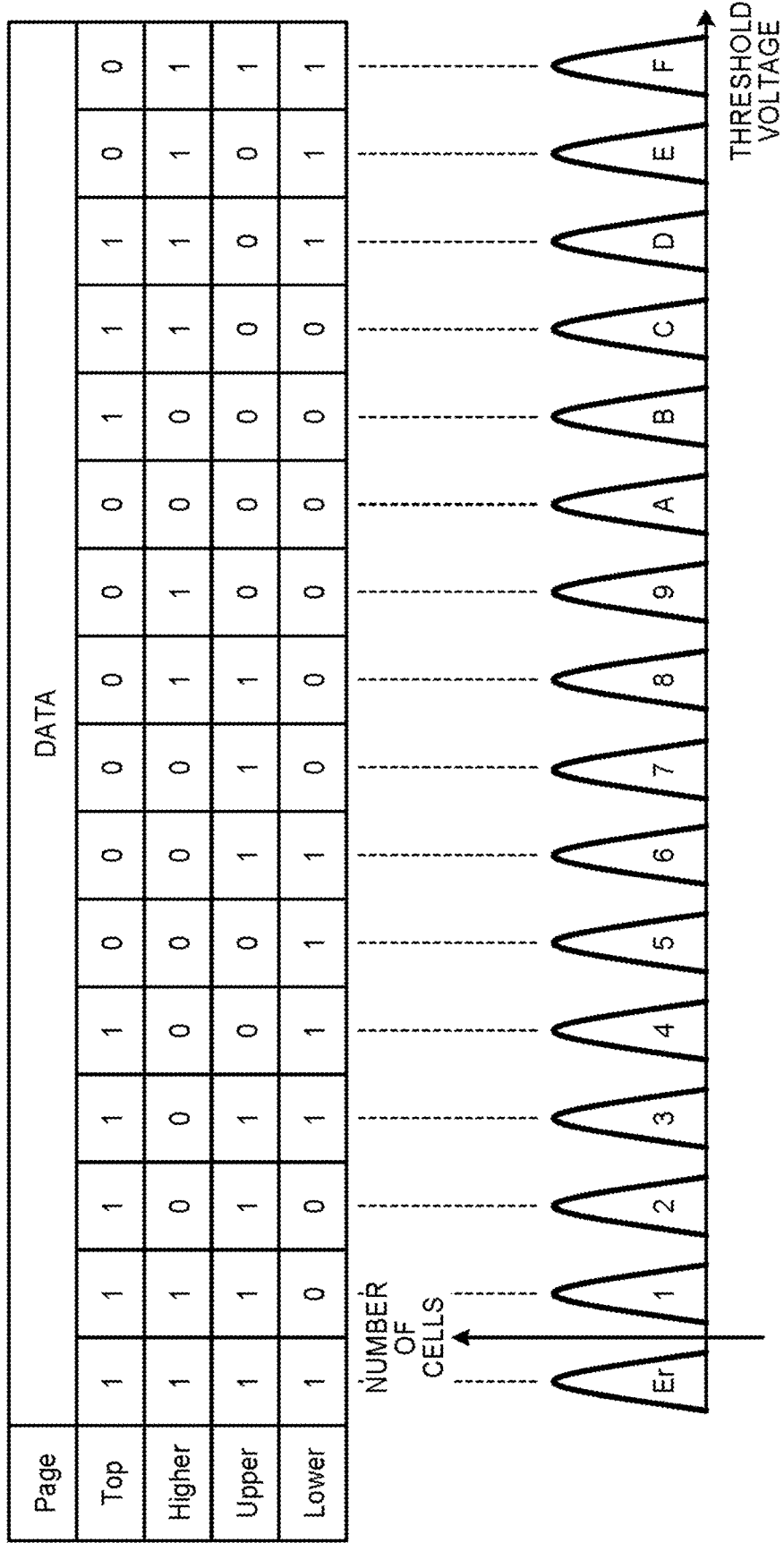
FIG. 14 is a diagram that illustrates an example a threshold voltage distribution and data coding of memory cells that are 4-bit/cell.

In a third embodiment, a data conversion for memory cells that are 4-bit/cell will be described. FIG. 14 is a diagram that illustrates an example a threshold voltage distribution and data coding of memory cells that are 4-bit/cell. As illustrated in a lower diagram of FIG. 14, in the case of memory cells that are 4-bit/cell, 16 distributions formed by distributions Er, 1, 2, 3, 4, 5, 6, 7, 8, 9, A, B, C, D, E, and F are included. The distribution Er has a lowest threshold voltage and corresponds to a threshold voltage distribution of the erased state. The threshold voltage is higher in order of distributions 1, 2, 3, 4, 5, 6, 7, 8, 9, A, B, C, D, E, and F. Thus, the distribution F has a highest threshold voltage. In the case of the memory cells that are 4-bit/cell, a state in which the memory cell MO illustrated in FIG. 5 is surrounded by adjacent cells M1, M2, M3, and M4 belonging to the distribution F is an arrangement pattern of the threshold voltage distribution for which the E to A phenomenon is degraded the most. In a case where memory cells that are 4-bit/cell are used, data values of four bits are associated with the 16 threshold distributions Er, 1, 2, 3, 4, 5, 6, 7, 8, 9, A, B, C, D, E, and F. In a case where four-bit cells are used, one physical sector corresponds to four pages. Four bits that can be stored in each memory cell correspond to these four pages. In this embodiment, such four pages will be referred to as a lower page, an upper page, a higher page, and a top page.

An upper diagram of FIG. 14 is a diagram that illustrates an example of data coding. As illustrated in the upper diagram of FIG. 14, the distribution Er corresponds to a data value of "1111", the distribution 1 corresponds to a data value of "1110", the distribution 2 corresponds to a data value of "1010", the distribution 3 corresponds to a data value of "1011", the distribution 4 corresponds to a data value of "1001", the distribution 5 corresponds to a data value of "0001", the distribution 6 corresponds to a data value of "0011", the distribution 7 corresponds to a data value of "0010", the distribution 8 corresponds to a data value of "0110", the distribution 9 corresponds to a data value of "0100", the distribution A corresponds to a data value of "0000", the distribution B corresponds to a data value of "1000", the distribution C corresponds to a data value of "1100", the distribution D corresponds to a data value of "1101", the distribution E corresponds to a data value of "0101", and the distribution F corresponds to a data value of "0111". In this embodiment, when data of the top page is denoted by Dt, data of the higher page is denoted by Dh, data of the upper page is denoted by Du, and data of the lower page is denoted by Dl, the data value of four bits will be denoted as "DtDhDuDl". The data coding illustrated in FIG. 14 is an example, and thus, the data coding is not limited to the example illustrated in FIG. 14.

FIG. 15 is a diagram that illustrates a data conversion executed by the conversion unit 50 in a case where the data coding illustrated in FIG. 14 is used. In the case illustrated in FIG. 15, a data conversion increasing the ratio of appearance of "0" to the total number of pieces of data of the lower page is executed for the lower page, a data conversion increasing the ratio of appearance of "0" to the total number of pieces of data of the upper page is executed for the upper page, a data conversion increasing the ratio of appearance of "0" to the total number of pieces of data of the higher page is executed for the higher page, and a data conversion increasing the ratio of appearance of "1" to the total number of pieces of data of the top page is executed for the top page.

Figure 16:
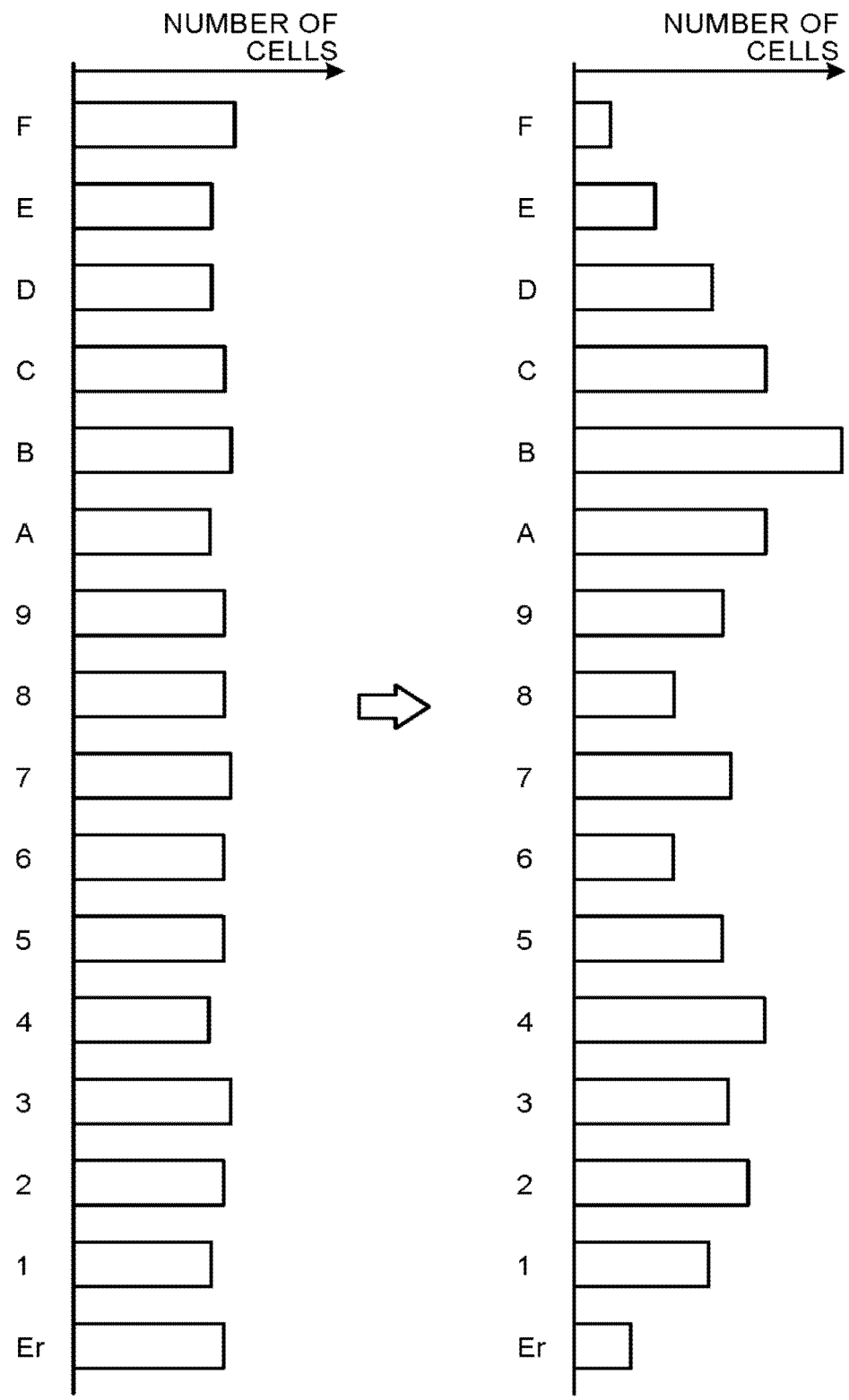
FIG. 16 is a diagram that illustrates a threshold voltage distribution before a data conversion and a threshold voltage distribution after the conversion in case of 4-bit/cell.

FIG. 16 is a diagram that illustrates threshold voltage distributions. The left side in FIG. 16 illustrates a threshold voltage distribution before the data conversion illustrated in FIG. 15, and the right side in FIG. 16 illustrates a threshold voltage distribution after the data conversion illustrated in FIG. 15. As illustrated on the left side in FIG. 16, before the data conversion, data is randomized by the randomizer 40, and accordingly, the frequencies of appearance of distributions Er, 1, 2, 3, 4, 5, 6, 7, 8, 9, A, B, C, D, E, and F are almost the same. In contrast to this, as illustrated on the right side in FIG. 16, after the data conversion, the frequency of appearance of the distribution B increases the most, the frequency of appearance of the distribution F decreases the most, and the frequency of appearance of the distribution Er decreases.

Figure 17:
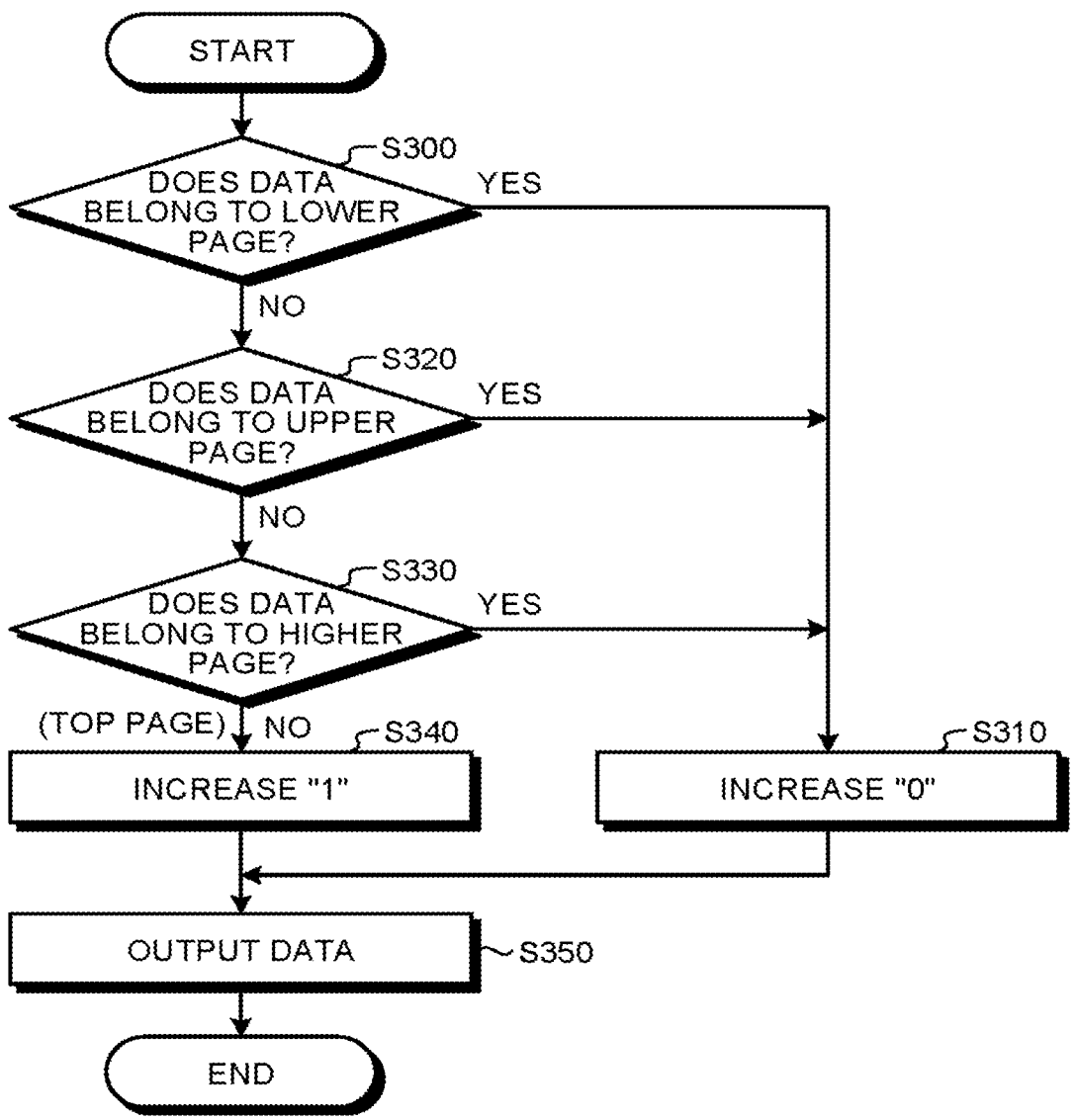
FIG. 17 is a flowchart that illustrates an example of a data conversion process according to a third embodiment.

FIG. 17 is a diagram that illustrates an example of a data conversion process, which is executed by the conversion unit 50, according to the third embodiment. The conversion unit 50 determines whether or not data input from the randomizer 40 belongs to the lower page (Step S300). In a case where the input data is determined to belong to the lower page based on this determination (Step S300, Yes), the conversion unit 50 executes the data conversion increasing the ratio of appearance of "0" of the input data (Step S310). The conversion unit 50 outputs converted data to the ECC unit 60 (Step S350). On the other hand, in a case where the input data is determined to belong to the upper page (Step S300, No and Step S320, Yes), the conversion unit 50 executes the data conversion increasing the ratio of appearance of "0" of the input data (Step S310). The conversion unit 50 outputs converted data to the ECC unit 60 (Step S350). In addition, in a case where the input data is determined to belong to the higher page (Step S200, No, Step S320, No, and Step S330, Yes), the conversion unit 50 executes the data conversion increasing the ratio of appearance of "0" of the input data (Step S310). The conversion unit 50 outputs converted data to the ECC unit 60 (Step S350). Furthermore, in a case where the input data is determined to belong to the top page (Step S200, No, Step S320, No and Step S330, No), the conversion unit 50 executes the data conversion increasing the ratio of appearance of "1" of the input data (Step 3340). The conversion unit 50 outputs converted data to the ECC unit 60 (Step S350).

The data conversion illustrated in FIG. 15 is effective in a case where the data coding illustrated in FIG. 14 is used. In a case where data coding different from that illustrated in FIG. 14 is used, the ratios of appearances of "0" and "1" of the data of each page may be changed such that the frequencies of appearance of the distribution Er having a lowest threshold voltage and the distribution F having a highest threshold voltage are decreased, and the frequencies of appearance of the distributions A to E each having a threshold voltage of an intermediate level are increased. As a technique of such a case, there are a first method that is similar to the data conversion illustrated in FIG. 11 and a second method different from the data conversion illustrated in FIG. 11. According to the first method, the ratio of appearance of one of "0" and "1" is increased for data of three pages among the lower page, the upper page, the higher page, and the top page and the ratio of appearance of the other is increased for the data of the remaining one page. According to the second method, the ratio of appearance of "1" is increased for data of two pages among the lower page, the upper page, the higher page, and the top page, and the ratio of appearance of "0" is increased for data of the remaining two pages. In the case of memory cells that are 4-bit/cell, any one of the first method and the second method may be used.

In this way, according to the third embodiment, the ratios of appearances of "0" and "1" of the data of each page are changed such that the frequencies of appearance of the distribution Er having the lowest threshold voltage and the distribution F having the highest threshold voltage are decreased, and the frequencies of appearance of the distributions A to E each having a threshold voltage of an intermediate level are increased. For this reason, the frequency of appearance of the arrangement pattern in which the distribution Er is surrounded by the distributions F can be decreased, and the number of error bits at the time of reading data can be efficiently decreased.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a nonvolatile memory including a plurality of memory cells and a word line connected to the plurality of memory cells, each of the plurality of memory cells being configured to store m-bit data in correspondence with one of first to n-th threshold areas, the first to n-th threshold areas being defined in order of lowest to highest threshold voltage, m being a natural number of two or more, n being a natural number of m-th power of two, the data being written in units of pages, the data of m pages being configured to be written into the plurality of memory cells connected to the word line, a value corresponding to each of the plurality of memory cells among data of each of first to m-th pages being x or y, x being a value of one of "1" and "0", and y being a value of one of "1" and "0" and being different from x; and
a controller configured to:
associate data stored in a certain memory cell of the plurality of memory cells with the first threshold area in a case where all of a first to m-th values are x, the first to m-th values corresponding to the certain memory cell among each of the data of first to m-th pages, the first to m-th values respectively corresponding to the first to m-th pages, and associate the data stored in the certain memory cell with the second threshold area in a case where the first value is y, and the second to m-th values are x;
execute a first data conversion on first data and write the converted first data into the first page, the first data being target data to be written into the first page, the first data conversion including increasing a ratio of y for a plurality of values included in the first data and respectively corresponding to the plurality of memory cells; and
execute a second data conversion on second data and write the converted second data into the second page, the second data being target data to be written into the second page, the second data conversion including increasing a ratio of x for a plurality of values included in the second data and respectively corresponding to the plurality of memory cells.

2. The memory system according to claim 1, wherein the x is "1" and the y is "0".

3. The memory system according to claim 2,
wherein the m is three, and
wherein the controller is configured to
associate the data stored in the certain memory cell with the eighth threshold area in a case where the first value is x, the second value is y, and the third value is x, execute a third data conversion on third data and write the converted third data into the third page, the third data being target data to be written into the third page, the third data conversion including increasing a ratio of y for a plurality of values included in the third data and respectively corresponding to the plurality of memory cells.

4. The memory system according to claim 3, wherein the controller is configured to:
associate the data stored in the certain memory cell with the third threshold area in a case where the first value and the second value are y, and the third value is x;
associate the data stored in the certain memory cell with the fourth threshold area in a case where the first value is y, the second value is y, and the third value is y;
associate the data stored in the certain memory cell with the fifth threshold area in a case where the first value is y, the second value is x, and the third value is y;
associate the data stored in the certain memory cell with the sixth threshold area in a case where the first value is x, the second value is x, and the third value is y; and
associate the data stored in the certain memory cell with the seventh threshold area in a case where the first value is x, the second value is y, and the third value is y.

5. The memory system according to claim 2,
wherein the m is four, and
wherein the controller is configured to:
execute a third data conversion on third data and write the converted third data into the third page, the third data being target data to be written into the third page, the third data conversion including increasing a ratio of y for a plurality of values included in the third data and respectively corresponding to the plurality of memory cells; and
execute a fourth data conversion on fourth data and write the converted fourth data into the fourth page, the fourth data being target data to be written into the fourth page, the forth data conversion including increasing a ratio of y for a plurality of values included in the fourth data and respectively corresponding to the plurality of memory cells.

6. The memory system according to claim 5, wherein the controller is configured to associate the data stored in the certain memory cell with the 16-th threshold area in a case where the first value is x, the second value is y, the third value is x, and the fourth value is x.

7. The memory system according to claim 6, wherein the controller is configured to:
associate the data stored in the certain memory cell with the third threshold area in a case where the first value is y, the second value is x, the third value is x, and the fourth value is y;
associate the data stored in the certain memory cell with the fourth threshold area in a case where the first value is x, the second value is x, the third value is x, and the fourth value is y;
associate the data stored in the certain memory cell with the fifth threshold area in a case where the first value is x, the second value is x, the third value is y, and the fourth value is y;
associate the data stored in the certain memory cell with the sixth threshold area in a case where the first value is x, the second value is y, the third value is y, and the fourth value is y;

associate the data stored in the certain memory cell with the seventh threshold area in a case where the first value is x, the second value is y, the third value is x, and the fourth value is y;
associate the data stored in the certain memory cell with the eighth threshold area in a case where the first value is y, the second value is y, the third value is x, and the fourth value is y;
associate the data stored in the certain memory cell with the ninth threshold area in a case where the first value is y, the second value is y, the third value is x, and the fourth value is x;
associate the data stored in the certain memory cell with the tenth threshold area in a case where the first value is y, the second value is y, the third value is y, and the fourth value is x;
associate the data stored in the certain memory cell with the 11-th threshold area in a case where the first value is y, the second value is y, the third value is y, and the fourth value is y;
associate the data stored in the certain memory cell with the 12-th threshold area in a case where the first value is y, the second value is x, the third value is y, and the fourth value is y;
associate the data stored in the certain memory cell with the 13-th threshold area in a case where the first value is y, the second value is x, the third value is y, and the fourth value is x;
associate the data stored in the certain memory cell with the 14-th threshold area in a case where the first value is x, the second value is x, the third value is y, and the fourth value is x;
associate the data stored in the certain memory cell with the 15-th threshold area in a case where the first value is x, the second value is y, the third value is y, and the fourth value is x; and
associate the data stored in the certain memory cell with the 16-th threshold area in a case where the first value is x, the second value is y, the third value is x, and the fourth value is x.

8. The memory system according to claim 2,
wherein the m is four, and
wherein the controller is configured to:
execute a third data conversion on third data and write the converted third data into the third page, the third data being target data to be written into the third page, the third data conversion including increasing a ratio of y for a plurality of values included in the third data and respectively corresponding to the plurality of memory cells; and
execute a fourth data conversion on fourth data and write the converted fourth data into the fourth page, the fourth data being target data to be written into the fourth page, the forth data conversion including increasing a ratio of x for a plurality of values included in the fourth data and respectively corresponding to the plurality of memory cells.

9. The memory system according to claim 8, wherein the controller is configured to execute the first to fourth data conversion to decrease a ratio of appearance of data associated with the 16-th threshold area among the data of the first to fourth pages to be written into the plurality of memory cells.

10. A method of controlling a nonvolatile memory including a nonvolatile memory that includes a plurality of memory cells and a word line connected to the plurality of memory cells, each of the plurality of memory cells being configured to store m-bit data in correspondence with one of first to n-th threshold areas, the first to n-th threshold areas being defined in order of lowest to highest threshold voltage, m being a natural number of two or more, n being a natural number of m-th power of two, the data being written in units of pages, the data of m pages being configured to be written into the plurality of memory cells connected to the word line, a value corresponding to each of the plurality of memory cells among data of each of first to m-th pages being x or y, x being a value of one of "1" and "0", and y being a value of one of "1" and "0" and being different from x, the method comprising:

associating data stored in a certain memory cell of the plurality of memory cells with the first threshold area in a case where all of a first to m-th values are x, the first to m-th values corresponding to the certain memory cell among each of the data of first to m-th pages, the first to m-th values respectively corresponding to the first to m-th pages;

associating the data stored in the certain memory cell with the second threshold area in a case where the first value is y, and the second to m-th values are x;

executing a first data conversion on first data and writing the converted first data into the first page, the first data being target data to be written into the first page, the first data conversion including increasing a ratio of y for a plurality of values included in the first data and respectively corresponding to the plurality of memory cells; and executing a second data conversion on second data and writing the converted second data into the second page, the second data being target data to be written into the second page, the second data conversion including increasing a ratio of x for a plurality of values included in the second data and respectively corresponding to the plurality of memory cells.

11. The method according to claim 10, wherein the x is "1" and the y is "0".

12. The method according to claim 11,
wherein the m is three, and
wherein the method further comprises:
    associating the data stored in the certain memory cell with the eighth threshold area in a case where the first value is x, the second value is y, and the third value is x;
    executing a third data conversion on third data and writing the converted third data into the third page, the third data being target data to be written into the third page, the third data conversion including increasing a ratio of y for a plurality of values included in the third data and respectively corresponding to the plurality of memory cells.

13. The method according to claim 12, the method further comprising:
    associating the data stored in the certain memory cell with the third threshold area in a case where the first value and the second value are y, and the third value is x;
    associating the data stored in the certain memory cell with the fourth threshold area in a case where the first value is y, the second value is y, and the third value is y;
    associating the data stored in the certain memory cell with the fifth threshold area in a case where the first value is y, the second value is x, and the third value is y;
    associating the data stored in the certain memory cell with the sixth threshold area in a case where the first value is x, the second value is x, and the third value is y; and
    associating the data stored in the certain memory cell with the seventh threshold area in a case where the first value is x, the second value is y, and the third value is y.

14. The method according to claim 11,
wherein the m is four, and
wherein the method further comprises:
    executing a third data conversion on third data and writing the converted third data into the third page, the third data being target data to be written into the third page, the third data conversion including increasing a ratio of y for a plurality of values included in the third data and respectively corresponding to the plurality of memory cells; and
    executing a fourth data conversion on fourth data and writing the converted fourth data into the fourth page, the fourth data being target data to be written into the fourth page, the forth data conversion including increasing a ratio of y for a plurality of values included in the fourth data and respectively corresponding to the plurality of memory cells.

15. The method according to claim 14, the method further comprising associating the data stored in the certain memory cell with the 16-th threshold area in a case where the first value is x, the second value is y, the third value is x, and the fourth value is x.

16. The method according to claim 15, the method further comprising:
    associating the data stored in the certain memory cell with the third threshold area in a case where the first value is y, the second value is x, the third value is x, and the fourth value is y;
    associating the data stored in the certain memory cell with the fourth threshold area in a case where the first value is x, the second value is x, the third value is x, and the fourth value is y;
    associating the data stored in the certain memory cell with the fifth threshold area in a case where the first value is x, the second value is x, the third value is y, and the fourth value is y;
    associating the data stored in the certain memory cell with the sixth threshold area in a case where the first value is x, the second value is y, the third value is y, and the fourth value is y;
    associating the data stored in the certain memory cell with the seventh threshold area in a case where the first value is x, the second value is y, the third value is x, and the fourth value is y;
    associating the data stored in the certain memory cell with the eighth threshold area in a case where the first value is y, the second value is y, the third value is x, and the fourth value is y;
    associating the data stored in the certain memory cell with the ninth threshold area in a case where the first value is y, the second value is y, the third value is x, and the fourth value is x;
    associating the data stored in the certain memory cell with the tenth threshold area in a case where the first value is y, the second value is y, the third value is y, and the fourth value is x;
    associating the data stored in the certain memory cell with the 11-th threshold area in a case where the first value is y, the second value is y, the third value is y, and the fourth value is y;
    associating the data stored in the certain memory cell with the 12-th threshold area in a case where the first value is y, the second value is x, the third value is y, and the fourth value is y;

associating the data stored in the certain memory cell with the 13-th threshold area in a case where the first value is y, the second value is x, the third value is y, and the fourth value is x;

associating the data stored in the certain memory cell with the 14-th threshold area in a case where the first value is x, the second value is x, the third value is y, and the fourth value is x;

associating the data stored in the certain memory cell with the 15-th threshold area in a case where the first value is x, the second value is y, the third value is y, and the fourth value is x; and associating the data stored in the certain memory cell with the 16-th threshold area in a case where the first value is x, the second value is y, the third value is x, and the fourth value is x.

17. The method according to claim 11,
wherein the m is four, and
wherein the method further comprises:
  executing a third data conversion on third data and writing the converted third data into the third page, the third data being target data to be written into the third page, the third data conversion including increasing a ratio of y for a plurality of values included in the third data and respectively corresponding to the plurality of memory cells; and
  executing a fourth data conversion on fourth data and writing the converted fourth data into the fourth page, the fourth data being target data to be written into the fourth page, the forth data conversion including increasing a ratio of x for a plurality of values included in the fourth data and respectively corresponding to the plurality of memory cells.

18. The method according to claim 17, the method further comprising executing the first to fourth data conversion to decrease a ratio of appearance of data associated with the 16-th threshold area among the data of the first to fourth pages to be written into the plurality of memory cells.

19. A memory system comprising:
  a nonvolatile memory including a plurality of memory cells and a word line connected to the plurality of memory cells, each of the plurality of memory cells being configured to store two-bit data in correspondence with one of first to fourth threshold areas, the first to fourth threshold areas being defined in order of lowest to highest threshold voltage, the data being written in units of pages, the data of two pages being configured to be written into the plurality of memory cells connected to the word line, a value corresponding to each of the plurality of memory cells among data of each of first and second pages being x or y, x being a value of one of "1" and "0", and y being a value of one of "1" and "0" and being different from x; and
  a controller configured to:
    associate data stored in a certain memory cell of the plurality of memory cells with the first threshold area in a case where both a first value and a second value are x, the first value corresponding to the certain memory cell among the data of first page, the second value corresponding to the certain memory cell among the data of second page;
    associate data stored in the certain memory cell with the second threshold area in a case where the first value is x, and the second value is y;
    associate data stored in the certain memory cell with the third threshold area in a case where the first value is y, and the second value is y;
    associate data stored in the certain memory cell with the fourth threshold area in a case where the first value is y, and the second value is x;
    execute a first data conversion on second data, the second data being target data to be written into the second page, the first data conversion including increasing a ratio of y for a plurality of values included in the second data and respectively corresponding to the plurality of memory cells; and
    write the converted second data into the second page.

20. The memory system according to claim 19, wherein the controller is configured to:
  execute a second data conversion on first data, the first data being target data to be written into the first page, the second data conversion including increasing a ratio of x for a plurality of values included in the first data and respectively corresponding to the plurality of memory cells; and
  write the converted first data into the first page.

* * * * *